(12) United States Patent
Jung

(10) Patent No.: US 6,536,237 B1
(45) Date of Patent: Mar. 25, 2003

(54) LASER ANNEALING SYSTEM

(75) Inventor: Yun-Ho Jung, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 388 days.

(21) Appl. No.: 09/143,505

(22) Filed: Aug. 28, 1998

(30) Foreign Application Priority Data

Aug. 30, 1997 (KR) .............................. 97-44218

(51) Int. Cl.⁷ ................................ C03B 25/00
(52) U.S. Cl. ................... 65/117; 219/121.86
(58) Field of Search ............ 65/33.2, 117; 204/157.41; 219/121.6, 121.86; 264/1.27, 1.37, 482, 346

(56) References Cited

U.S. PATENT DOCUMENTS

| | | | | |
|---|---|---|---|---|
| 5,009,689 A | * | 4/1991 | Haisma et al. | 65/33.2 |
| 5,102,833 A | * | 4/1992 | Sehgal et al. | 501/4 |
| 5,227,608 A | * | 7/1993 | Yoshida et al. | 219/121.68 |
| 5,322,538 A | * | 6/1994 | Kondo et al. | 65/31 |
| 5,332,879 A | * | 7/1994 | Radhakrishnan et al. | 219/121.69 |
| 5,634,955 A | * | 6/1997 | Araujo et al. | 65/17.2 |
| 5,869,803 A | * | 2/1999 | Noguchi et al. | 219/121.86 |

* cited by examiner

*Primary Examiner*—Sean Vincent
(74) *Attorney, Agent, or Firm*—McKenna Long & Aldridge LLP

(57) ABSTRACT

The present invention relates to a laser annealing system which reduces damages and contamination to a chamber window by adding a buffer window between the chamber window and a silicon film being annealed by a laser beam. The laser annealing system includes a chamber window for passing a laser beam therethrough, a chamber wall constituting an outer frame of the chamber, wherein the chamber wall and the chamber window form a sealed inner space, a process chamber in which a laser annealing takes place by annealing the substrate with a laser, and a buffer layer formed between the chamber window and the substrate to reduce any contaminants from the annealing process from being deposited directly on the chamber window. The buffer layer may be equipped with a predetermined pattern to selectively block the laser beam in accordance with the pattern in order to selectively anneal the silicon film formed on the substrate.

34 Claims, 2 Drawing Sheets

LASER ANNEALING SYSTEM

BACKGROUND OF THE INVENTION

1. Field of Invention

The present invention relates to a laser annealing system which prevents damage to a chamber window by inserting a buffer window between the chamber window of a process chamber (hereinafter referred to as a "chamber") and a film which is annealed by a laser.

2. Discussion of Related Art

A laser annealing technology can form a polycrystalline silicon film having high electron mobility by annealing an amorphous silicon film, which is formed on a poor heat-resisting glass substrate with a laser under low temperature. In a laser annealing technology, an amorphous silicon film is formed on a glass substrate at about 300° C., hydrogen is released out of the amorphous silicon film by a heat annealing at about 450° C., and then the film is irradiated with a laser beam having short pulse duration. An annealing system is used for a laser annealing process in fabricating a liquid crystal display (LCD), more specifically, used for crystallizing or activating a film with a laser.

FIG. 1 shows a prior art schematic diagram of a chamber used in a laser annealing system. Referring to FIG. 1, a chamber wall 11 constituting an outer frame of the chamber provides an inner space in which a substrate supporter 18 is placed for supporting a substrate 20 to be annealed. The drawing shows upper and lower parts of the chamber wall 11. The inner space is exposed through a predetermined portion of the upper part of the chamber wall 11. In particular, the inner space is sealed with a chamber window 13 preferably made of quartz.

The inner space sealed with the chamber wall 11 and the chamber window 13 is maintained under a vacuum state. The chamber window 13 has a thickness over 2 cm so as to withstand the vacuum state. Unfortunately, the chamber window 13 made of quartz is very expensive since the price of the chamber window 13 is directly proportional to its thickness.

The technique of annealing an amorphous silicon film with a laser and the above-mentioned chamber of the laser annealing system is explained by referring to FIGS. 1 and 2. FIG. 2 shows a substrate on which amorphous silicon patterns to be irradiated with a laser are formed. Referring to FIG. 2, predetermined amorphous silicon patterns 21-1 to 21-3 are defined on a substrate 20. The pattern 21-1 is placed in the center of the substrate. The pattern 21-2 is on the left side of the pattern 21-1. The pattern 21-3 is on the upper side of the pattern 21-1. The amorphous silicon patterns 21-2 and 21-3 on the substrate 20 are going to be irradiated with a laser in order to attain polycrystalline silicon from amorphous silicon by crystallization.

A laser annealing is achieved by supporting the substrate 20 on which an amorphous silicon film has been formed on a support 18 in the inner space of the chamber of a laser annealing system, and by having the amorphous film irradiated with a laser beam having its focus fixed from the outside of the chamber through the chamber window 13. In this process, diameters of the laser beams corresponding to the sizes of the patterns have to be set to crystallize the amorphous silicon patterns 21-2 and 21-3. Typically, the amorphous silicon pattern 21-2 is irradiated with a laser beam of which diameter corresponds to the size of the pattern 21-2.

The remaining amorphous silicon pattern 21-3 is irradiated along with the pattern by a laser beam having the corresponding diameter. Namely, the crystallization, the activation and the like are processed by having the surface of the amorphous silicon film irradiated through the chamber window 13 with a laser beam wherein the substrate is placed on the support 18 in the inner space of the chamber. In this case, a portion of the amorphous film may be vaporized when the energy density of the laser beam is excessively larger than is necessary for the thickness of the film. Moreover, the contaminants on the surface of the film which have low evaporation points are vaporized.

Such vaporized components of the film and the contaminants are deposited on the lower surface of the chamber window 13 so that the chamber window 13 is damaged or contaminated. The damage or the contamination on the chamber window 13 also interferes with the laser beam passing through the chamber window 13, thereby causing a low process yield in the laser annealing process. Accordingly, the lower surface of the chamber window 13 under which the contaminants have been deposited needs to be frequently cleaned or polished, or the contaminated chamber window should be replaced with an expensive brand-new one.

Moreover, it is impossible for a laser to be applied to the film in accordance with its pattern as the film is irradiated with the laser directly through the chamber window 13 in the laser annealing system according to prior art. Accordingly, the process takes more time and increasing the process yield becomes complicated since the diameter and the position of the laser beam must be adjusted frequently.

SUMMARY OF THE INVENTION

Accordingly, the present invention is directed to a laser annealing system that substantially obviates one or more of the problems due to limitations and disadvantages of the prior art.

The object of the present invention is to provide a laser annealing system which prevents damage on a chamber window by stopping the contaminants being deposited on a chamber window with a buffer window between the chamber window and the film which is irradiated with a laser.

Another object of the present invention is to provide a laser annealing system which defines laser patterns by forming a buffer window to have a predetermined shape.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes a chamber window through which a laser beam passes, a chamber wall constituting an outer frame wherein the chamber wall and the chamber window forming a sealed inner space therein. The laser annealing system further includes a process chamber for annealing the substrate with a laser, and a buffer layer between the chamber window and the substrate. In this case, a pattern of a laser beam passing through the buffer window takes after a predetermined pattern formed on the buffer window.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF THE PREFERRED EMBODIMENTS

Reference will now be made in detail to the preferred embodiment of the present invention, an example of which is illustrated in the accompanying drawings.

Figure 3:
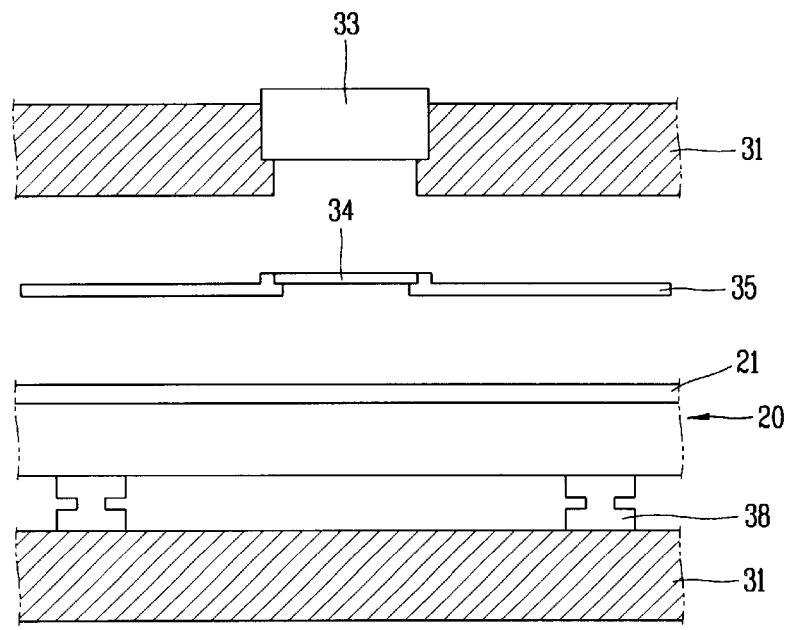
FIG. 3 shows a schematic drawing of a laser annealing system according to the present invention.

FIG. 3 shows a cross-sectional view of a chamber in a laser annealing system according to the present invention. Referring to FIG. 3, a chamber wall 31 constructing an outer frame of a chamber defines an inner space in which a support 38 supporting a substrate 20 being annealed by a laser, is provided. The drawing shows upper and lower parts of the chamber wall 31. The inner space is exposed through a predetermined portion of the upper part of the chamber wall 31. In particular, the inner space is sealed with a chamber window 33 made of quartz or other suitable materials known to one of ordinary skill in the art. The inner space sealed with the chamber wall 31 and the chamber window 33 is maintained under a vacuum state. The chamber window 33 has a thickness over 2 cm so as to withstand the pressure of the vacuum state.

In the present invention, a buffer window 34 made preferably of quartz is added between the chamber window 13 and the film 21 on the substrate 20 which is supported by the support 38. The buffer window 34 is preferably supported by and connected to a buffer window support 36. The combination of the buffer window 34 and the buffer window support 35, which separate the chamber window 33 from the film, keep the contaminants or byproducts evaporated from the film from being deposited on the chamber window 33.

The buffer window 34 may be constructed thinner than the chamber window 33 due to the equal presence of the vacuum state in the upper and the lower space. And, it is preferable that a non-reflective film is coated on top of the buffer window 34 for an effective use of a laser. As mentioned in the foregoing, the cost of the thin buffer layer is much lower than that of the chamber window 33 having the thickness of 2 cm or more.

Figure 1:
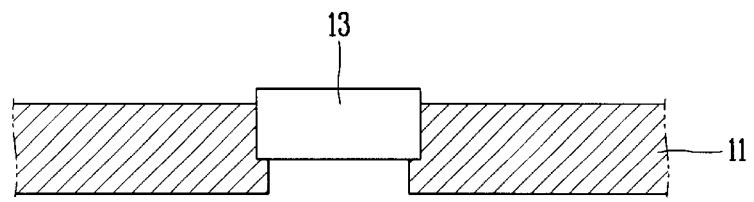
FIG. 1 shows a schematic drawing of a laser annealing system according to prior art.
Figure 1:
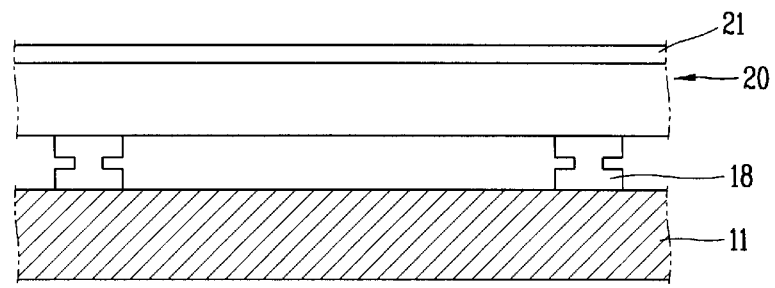
Figure 2:
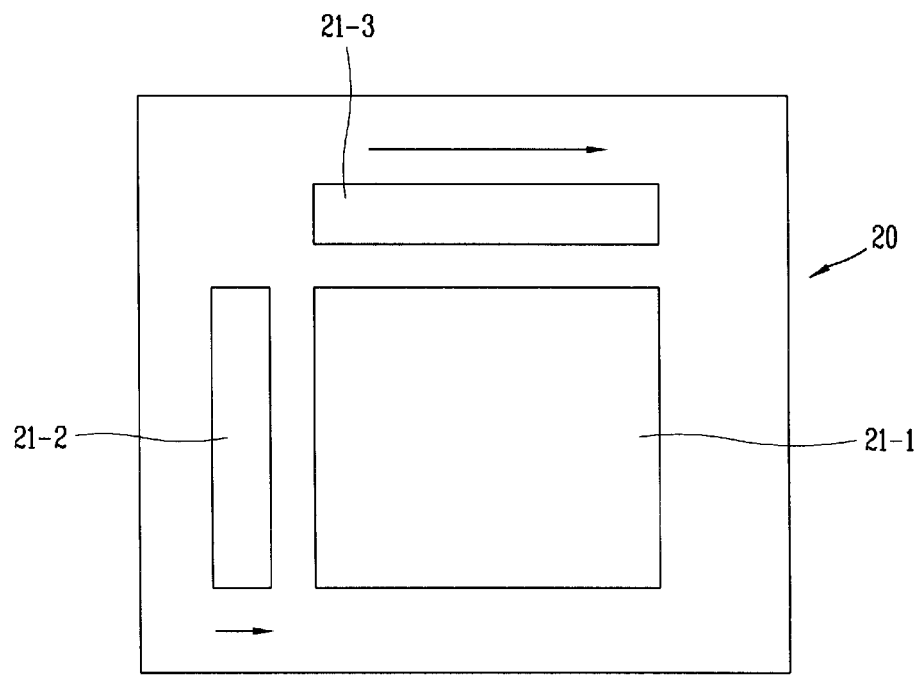
FIG. 2 shows an example of a substrate which is to be annealed by a laser.
Figure 4:
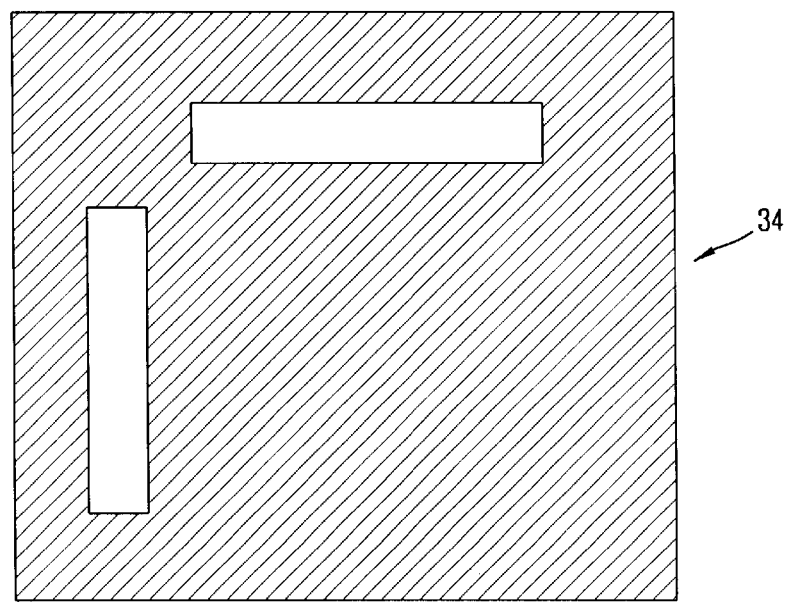
FIG. 4 shows an embodiment of a buffer window pattern of a laser annealing system according to the present invention.

The technique of annealing an amorphous silicon film with a laser and the above-mentioned chamber of the laser annealing system is explained by referring to FIGS. 2 and 4. FIG. 2 shows a substrate on which the amorphous silicon patterns 21-2 to 21-3 are formed. The amorphous silicon patterns on the substrate are the same as the foregoing. FIG. 4 shows an embodiment of a buffer window pattern of a laser annealing system according to the present invention wherein the amorphous silicon patterns are irradiated with a laser through the buffer window 34.

Referring to FIG. 4, the buffer window is coated with a cutoff layer except a portion through which a laser passes. Accordingly, the laser cannot pass through the cutoff layer but can pass through the portion where no cutoff layer is coated. In the drawing, oblique lines depict a part where the cutoff layer is coated.

A laser annealing is achieved by the steps of supporting the substrate 20 on which a film is formed 20 with a support 38 formed in an inner space of a chamber in the above-mentioned laser annealing system, and by having the amorphous silicon layer irradiated with a laser beam through the chamber window 33, wherein the focus of the laser beam is controlled and set up outside the chamber. In this case, the laser beam passes through the chamber window 33, then passes through the buffer window 34, and finally, reaches the film to be annealed. Namely, the crystallization or the activation of the film is achieved by having the laser beam pass through the chamber window 33 and the buffer window 34 and then by applying the laser beam to the film on the substrate which is placed on the support 38.

In this process, a certain portion of the film is evaporated when the energy density of the laser is excessively larger than is necessary with respect to the thickness of the film. In addition, the contaminants formed on the surface of the film having low evaporation points are evaporated. Eventually, the evaporated contaminants and the partial components of the film are deposited in the under surface of the buffer window 34 instead of the chamber window 33. Thus, it is impossible for the contaminants to reach the chamber window 33 because the buffer window 34 is in the way of the contaminants. Moreover, a damaged or unclean buffer window 34 due to the contaminants may be easily replaced with a new one. This is advantageous because the replacement of the buffer window 34 made of relatively thinner material than that of the chamber window 33 is desirably less expensive.

In the present invention, the cross-sectional pattern of the laser through the chamber window 33 in the present invention is controlled by the buffer window 34 and then reaches the film. In this case, the laser only passes through a portion of the buffer window 34 where no cutoff layer is formed. Thus, a single irradiation of the laser on the buffer window 34 enables the amorphous silicon patterns 21-2 and 21-3 disposed immediately below the buffer window 34 to be selectively exposed to the laser. Similarly, the amorphous silicon regions blocked by the cutoff layer on the buffer window 34 are not exposed.

Accordingly as shown in the prior art, the multiple irradiations of the lasers or the adjustments of the diameters of the laser beams according to the irradiated film patterns are unnecessary. In other words, a predetermined pattern of the cutoff layer is defined in accordance with the pattern of the film to be irradiated with a laser, and then the irradiation is achieved by a single scanning through the buffer window 34 with a laser beam of which diameter encompasses the whole surface of the buffer window. Therefore, the buffer window may be used as a mask for a laser irradiation.

In the above explanation, a laser is applied only to the predetermined patterns as an example. However, once a cutoff layer for stopping a laser is defined according to a predetermined shape, various parts can be irradiated with a laser or other suitable radiation source known to one of ordinary skill in the art.

Consequently, the present invention prevents damage on a chamber window by adding a buffer window and applies a patterned laser to a substrate by forming a cutoff layer having a predetermined patter to selectively block the laser with the buffer window.

It will be apparent to those skilled in the art that various modifications and variations can be made in a laser annealing system of the present invention without departing from the spirit or scope of the inventions. Thus, it is intended that the present invention covers the modifications and variations of this invention provided they come within the scope of the appended claims and equivalents.

What is claimed is:

1. An annealing system for annealing a target material with a radiation source, the annealing system comprising:
    a window for passing the radiation source therethrough;
    a process region aligned with the window and disposed in a path of the radiation source to receive the radiation source, the process region containing the target material being annealed; and
    a buffer layer aligned with the window and the process chamber and formed in the path of the radiation source, wherein the annealing produces a byproduct containing contaminants, and the buffer layer formed between the window and the process region blocks the byproduct from reaching the window.

2. An annealing system of claim 1, further comprising a chamber wall constituting an outer frame of the annealing system, wherein the chamber wall and the window define a sealed inner space to house the process region.

3. An annealing system of claim 1, wherein the window is made of quartz.

4. An annealing system of claim 1, wherein the target material being annealed is an amorphous silicon which transforms into a polycrystalline silicon.

5. An annealing system of claim 1, wherein the radiation source is a laser.

6. An annealing system of claim 1, wherein the buffer layer is made of quartz.

7. An annealing system of claim 1, wherein the buffer layer is mounted on a support frame placed between the window and the target material to block the byproduct from reaching the window.

8. An annealing system of claim 1, wherein the buffer layer has an anti-reflective layer.

9. An annealing system of claim 1, wherein the buffer layer is coated with a radiation blocking material layer.

10. An annealing system of claim 9, wherein the radiation blocking material layer of the buffer layer has a predetermined pattern for selectively blocking the radiation source from reaching the target material.

11. An annealing system of claim 10, wherein the predetermined pattern defines a first region not covered by the radiation blocking material layer and a second region covered by the radiation blocking material, and the first region has a first width and the radiation source has a coverage diameter greater than the first width.

12. An annealing system of claim 11, wherein the window is made of quartz.

13. An annealing system of claim 12, wherein the target material being annealed is an amorphous silicon which transforms into a polycrystalline silicon.

14. An annealing system of claim 13, wherein the radiation source is a laser.

15. An annealing system of claim 14, wherein the buffer layer is made of quartz.

16. An annealing system of claim 15, wherein the buffer layer is mounted on a support frame placed between the window and the target material to block the byproduct from reaching the window.

17. An annealing system for annealing a target material with a radiation source, the annealing system comprising:
    window means for passing the radiation source therethrough;
    process region means for receiving the radiation source, the process region means being aligned with the window means to be disposed in a path of the radiation source and having the target material being annealed with the radiation source; and
    buffer means for blocking a byproduct of annealing from reaching the window means, the buffer means aligned with the window means and the process chamber and formed in the path of the radiation source.

18. An annealing system of claim 17, further comprising a chamber wall constituting an outer frame of the annealing system, wherein the chamber wall and the window define a sealed inner space to house the process region means.

19. An annealing system of claim 17, wherein the window means is made of quartz.

20. An annealing system of claim 17, wherein the target material being annealed is an amorphous silicon which transforms into a polycrystalline silicon.

21. An annealing system of claim 17, wherein the radiation source is a laser.

22. An annealing system of claim 17, wherein the buffer means is made of quartz.

23. An annealing system of claim 17, wherein the buffer means is mounted on a support frame placed between the window means and the target material to block the byproduct from reaching the window means.

24. An annealing system of claim 17, wherein the buffer means is coated with a radiation blocking means.

25. An annealing system of claim 24, wherein the radiation blocking means has a predetermined pattern for selectively blocking the radiation source from reaching the target material.

26. An annealing system of claim 25, wherein the predetermined pattern defines a first region not covered by the radiation blocking means and a second region covered by the radiation blocking means, and the first region has a first width and the radiation source has a coverage diameter greater than the first width.

27. A method for annealing a target material with a radiation source, comprising the steps of:
    arranging a window for passing the radiation source therethrough;
    placing the target material in a process region for receiving the radiation source, the target material being annealed is aligned with the window and placed in a path of the radiation source; and
    placing a buffer window between the window and the target material for blocking a byproduct of annealing from reaching the window, the buffer window being aligned with the window and the target material and formed in the path of the radiation source; and
    annealing the target material with the radiation source.

28. A method of claim 27, wherein the target material being annealed is an amorphous silicon which transforms into a polycrystalline silicon.

29. A method of claim 27, wherein the radiation source is a laser.

30. A method of claim 27, wherein the buffer window is made of quartz.

31. A method of claim 27, wherein the buffer window is mounted on a support frame placed between the window and the target material to block the byproduct from reaching the window.

32. The annealing system of claim 1, wherein the byproduct includes vaporized contaminants and wherein the buffer layer prevents the vaporized contaminants from being deposited on the window.

33. The annealing system of claim 17, wherein the byproduct includes vaporized contaminants and wherein the buffer means prevents the vaporized contaminants from being deposited on the window.

34. The method of claim 27, wherein the step of placing the buffer window between the window and the target includes placing the buffer window such that vaporized contaminants contained in said byproduct are prevented from being deposited on the window.

* * * * *